United States Patent
Cusey et al.

(10) Patent No.: US 10,886,932 B2
(45) Date of Patent: Jan. 5, 2021

(54) METHOD AND APPARATUS FOR ALIGNMENT ADJUSTMENT OF ENCODER SYSTEMS

(71) Applicant: TT Electronics PLC, Carrollton, TX (US)

(72) Inventors: James P. Cusey, Dallas, TX (US); Brent Hans Larson, Dallas, TX (US)

(73) Assignee: TT ELECTRONICS PLC, Carrollton, TX (US)

( * ) Notice: Subject to any disclaimer, the term of this patent is extended or adjusted under 35 U.S.C. 154(b) by 0 days.

(21) Appl. No.: 16/563,058

(22) Filed: Sep. 6, 2019

(65) Prior Publication Data

US 2020/0083898 A1   Mar. 12, 2020

Related U.S. Application Data

(60) Provisional application No. 62/729,474, filed on Sep. 11, 2018.

(51) Int. Cl.
*H03M 1/22* (2006.01)
*H03M 1/30* (2006.01)
(Continued)

(52) U.S. Cl.
CPC ........ *H03M 1/303* (2013.01); *G01D 5/24404* (2013.01); *G01D 5/34715* (2013.01); *H03M 1/206* (2013.01); *H03M 1/285* (2013.01)

(58) Field of Classification Search
CPC ...... H03M 1/303; H03M 1/206; H03M 1/285; G01D 5/34715
(Continued)

(56) References Cited

U.S. PATENT DOCUMENTS 5,999,636 A   12/1999   Juang
6,355,927 B1   3/2002   Snyder
(Continued)

FOREIGN PATENT DOCUMENTS

CN   108027259 A   5/2011
EP   1308700   7/2003
(Continued)

OTHER PUBLICATIONS

Office Action and Search Report dated Sep. 5, 2019 for TW Application No. 108104828.
(Continued)

*Primary Examiner* — Peguy Jean Pierre
(74) *Attorney, Agent, or Firm* — Haynes and Boone, LLP

(57) ABSTRACT

An encoder system includes a configurable detector array, wherein the configurable detector array includes a plurality of detectors. In an embodiment, the encoder system includes an application-specific integrated circuit (ASIC). The encoder system may also include a memory operable to store a partition map that defines a state for each of the plurality of detectors. In an embodiment, the memory includes a non-volatile memory. The encoder system may also include a controller, such as a microcontroller, operable to read from the memory the partition map and to adjust the partition map according to a misalignment measurement before configuring the configurable detector array. The encoder system may also include an emitter operable to generate a flux modulated by a motion object, wherein the configurable detector array is operable to receive the flux and generate respective current outputs for each of the detectors in response to the flux.

23 Claims, 14 Drawing Sheets

(51) Int. Cl.
*H03M 1/28* (2006.01)
*G01D 5/347* (2006.01)
*G01D 5/244* (2006.01)
*H03M 1/20* (2006.01)

(58) Field of Classification Search
USPC .................................................. 341/13, 137
See application file for complete search history.

(56) References Cited

U.S. PATENT DOCUMENTS

| | | | |
|---|---|---|---|
| 6,501,905 | B1 | 12/2002 | Kimura |
| 6,816,091 | B1 | 11/2004 | Chee |
| 6,928,386 | B2 | 8/2005 | Hasser |
| 7,619,210 | B2 | 11/2009 | Wong |
| 8,169,201 | B2 | 5/2012 | Oberhauser |
| 8,169,619 | B2 | 5/2012 | Oberhauser |
| 8,895,911 | B2 * | 11/2014 | Takahashi .............. G01D 5/38 250/231.1 |
| 2006/0243895 | A1 | 11/2006 | Nordenfelt |
| 2006/0280358 | A1 | 12/2006 | Ishikawa |
| 2007/0003225 | A1 | 1/2007 | Moteki |
| 2008/0111061 | A1 | 5/2008 | Wong |
| 2008/0203283 | A1 * | 8/2008 | Chin ................ G01D 5/34715 250/231.13 |
| 2012/0104236 | A1 | 5/2012 | Thor |
| 2012/0155532 | A1 | 6/2012 | Puri |
| 2014/0218388 | A1 | 8/2014 | Higgins et al. |
| 2016/0020168 | A1 | 1/2016 | Kao |
| 2018/0266852 | A1 | 9/2018 | Cusey |
| 2019/0158836 | A1 * | 5/2019 | Amer .................. H04N 19/182 |
| 2019/0212172 | A1 | 7/2019 | Larson |

FOREIGN PATENT DOCUMENTS

| | | |
|---|---|---|
| TW | 201504598 A | 2/2015 |
| TW | 201534871 | 9/2015 |

OTHER PUBLICATIONS

Office Action dated Jan. 6, 2020 for U.S. Appl. No. 15/980,225.
Office Action dated Apr. 11, 2019 for U.S. Appl. No. 15/681,182.
Notification of Transmittal of International Search Report and Written Opinion for Application No. PCT/US2017/060705, dated Feb. 12, 2018, 15 pages.
Translation of Office Action dated Sep. 6, 2018 for Taiwan Patent Application No. 106139680.
International Search Report and Written Opinion dated Mar. 8, 2019 for PCT Patent Application No. PCT/US19/12731, 16 pages.
Search Report and Written Opinion for PCT/US19/50433 dated Jan. 13, 2020.
Office Action and Search Report dated Sep. 15, 2020 for Taiwan Patent Application No. 108132567. 9 pages.

* cited by examiner

METHOD AND APPARATUS FOR ALIGNMENT ADJUSTMENT OF ENCODER SYSTEMS

CROSS-REFERENCE TO RELATED APPLICATIONS

The present application claims the benefit of U.S. Provisional Application No. 62/729,474 filed Sep. 11, 2018, the disclosure of which is incorporated by reference herein in its entirety.

BACKGROUND

An encoder system, such as an optical encoder, may include an electro-mechanical device that detects and converts positions (e.g., linear and/or angular positions) of an object to analog or digital output signals by using one or more photodetectors. There are different types of encoders, such as rotary encoders and linear encoders. Regardless of type and specific mechanical construction, an exemplary encoder system generally uses a light source, a light modulator located in the source light pathway, and an encoder chip (e.g., an optical sensor integrated circuit) including a plurality of photodetectors that receive the modulated light and generate electrical signals in response thereto. To maintain accuracy of an encoder system, manufacturers often take actions to physically align various components along the light pathway, such as the light modulator and the encoder chip. The mechanical alignment is typically done by hand with a trained operator using magnification techniques. This alignment is achieved by moving the encoder chip until an optimal pattern is found. This exercise when done manually adds to manufacturing time and cost or requires higher tolerances of mechanical components which drives up cost.

Accordingly, improvements in an alignment adjustment process of encoder systems are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
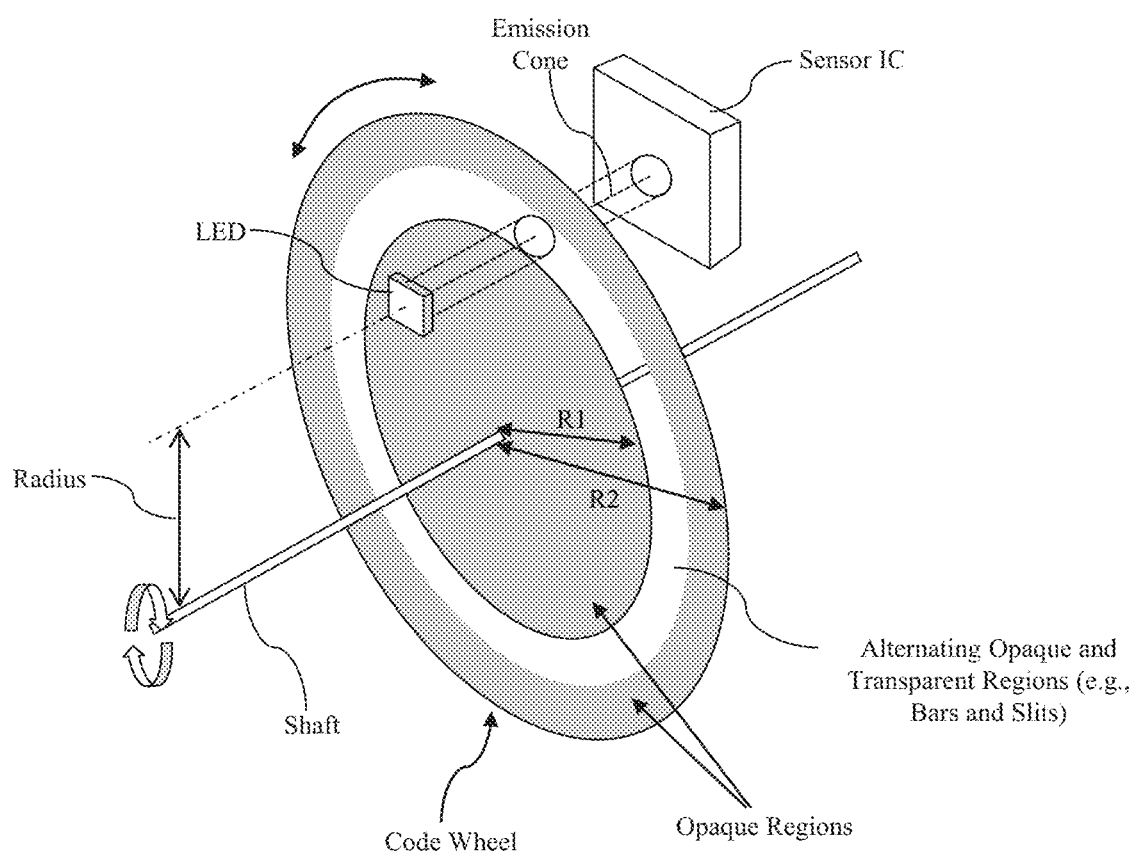
FIG. 1 is an illustration of an exemplary transmissive optical encoder, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

The present disclosure is generally related to encoder systems and methods thereof, more particularly to an optical encoder with a configurable photodetector array and methods for automatic alignment adjustment. An optical encoder is generally used for detecting and converting position information of a target object to analog or digital output signals. For the purposes of simplicity, the embodiments described herein will use a code wheel (for rotary encoders) as an example of the target object, although the scope of embodiments may include any suitable optical detection of moving objects. For example, the principles in the present disclosure can also be used for alignment adjustment for encoders targeted in detecting linear movements (e.g., a code strip for linear encoders). Various embodiments of the present disclosure enable a technique to automate an alignment adjustment for encoders by using a configurable photodetector array, which provides users with improved manufacturability as the alignment adjustment process may be automated and not subject to human variation. Further, processing time can be shortened as measurements can be quickly made and applied via a computer program. The use of a configurable photodetector array further allows a single integrated circuit (IC) design for encoder modules of varying configurations without significant degradation of output signal quality, thus enabling the lower cost arising from higher volume and a simpler supply chain resulting from managing fewer IC part numbers.

Additionally, other embodiments may employ a magnetic detector. However, for ease of illustration, the embodiments described herein focus on optical detection, and it is understood that such principles may be applied to magnetic detection systems.

Optical encoders may include incremental and absolute encoders that are used to track motion and can be used to determine position and velocity. This can be either linear or rotary motion. Because the direction can be determined, very accurate measurements can be made. Regardless of type and specific mechanical construction, optical encoders generally use the same optical detection mechanism and components: a light source, a light modulator located in the source light pathway, and light detectors that receive the modulated light and generate electrical signals in response thereto. The light source may include, for example, a light-emitting diode (LED), and may emit electromagnetic radiation within the infrared to ultraviolet spectral region. In some embodiments, the light source may include a laser emitter. The light modulator is commonly in the form of a thin disk, such as a code wheel, concentric with the rotating shaft and having its faces perpendicular to the source light pathway. The code wheel may have a pattern of transparent and opaque areas formed on the faces so that as the shaft rotates, the source light passing through the wheel faces is interrupted in accordance with the pattern. The unique light pattern illuminated by the wheel is sensed by the light detectors. In response, the light detectors generate electrical signals that interchange between a high voltage level and a low voltage level and that can be graphically represented as continuous time-varying waves. FIG. 1 depicts an embodiment of a transmissive rotary optical encoder. Within FIG. 1, the region of a code wheel labeled "alternating opaque and transparent regions" consists of one or more tracks. In this example, a track is the set of points on the code wheel whose distance from the center of the shaft is between an inner radius R1 and an outer radius R2, and the opaque (e.g., bars) and transparent (e.g., slits) regions of the track are arranged such that the track has discrete rotational symmetry of order N about the shaft center, where N≥1. One such track on an incremental encoder is known as the quadrature track, whose order of rotational symmetry is termed the pulses per revolution (PPR) of the encoder system.

Figure 2:
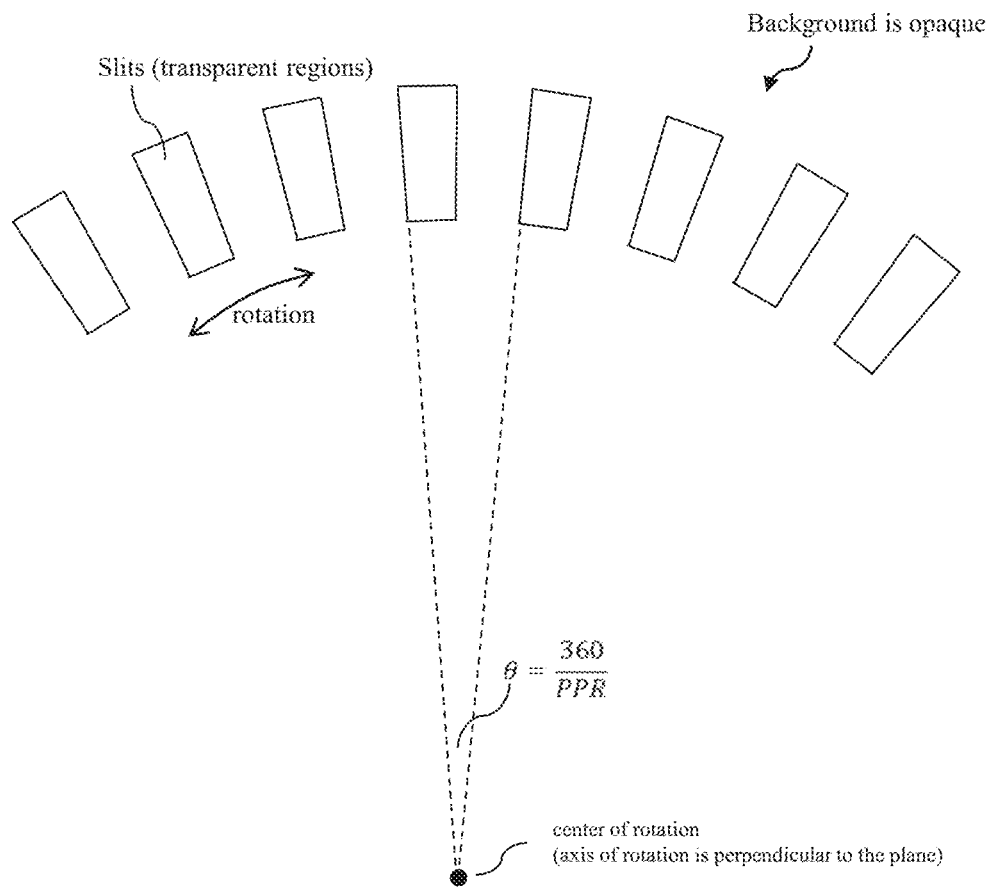
FIG. 2 is an illustration of an exemplary pattern of quadrature-track code wheel slits in a transmissive optical encoder system, in accordance with some embodiments.

FIG. 2 depicts an example embodiment of a quadrature track. The optical sensor integrated circuit (IC) in FIG. 1 contains a plurality of photoactive areas, grouped into regions, such as A+, A−, B+, and B− regions, and aligned to the quadrature track of the code wheel (i.e. at a distance from the axis of code wheel rotation between R1 and R2 of the quadrature track). Each of the A+, A−, B+, and B− regions is composed of one or more discrete photoactive areas connected in parallel (so that the photocurrents of the parallel discrete photoactive areas are additive), as described in more detail below. A light emitter (e.g., an LED) illuminates lights towards the photoactive areas. The light would be blocked by the opaque regions of the track or pass through the transparent regions and arrive at the photoactive areas.

Figure 3:
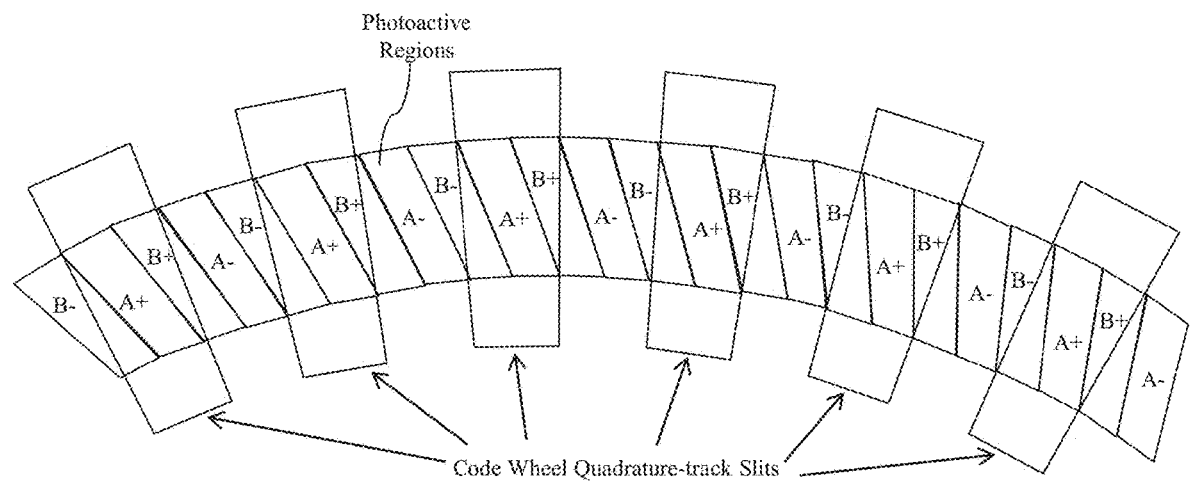
FIG. 3 shows an exemplary embodiment of quadrature assignments (A+, A−, B+, B−) to a photoactive region on an optical sensor IC, superimposed upon a code wheel's quadrature track shown in FIG. 2, in accordance with some embodiments.
Figure 4:
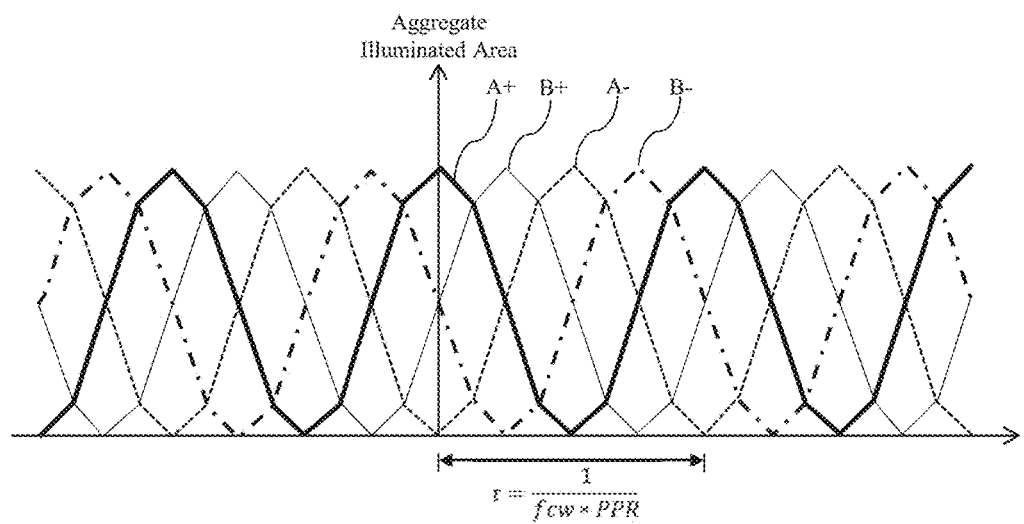
FIG. 4 shows aggregated illuminated areas of A+, A−, B+, B− regions in FIG. 3 when a code wheel is rotated clockwise at a constant rate, in accordance with some embodiments.

FIG. 3 depicts an exemplary embodiment of the A+, A−, B+, and B− regions of the optical sensor IC in an encoder system with part of the code wheel quadrature track superimposed. FIG. 4 depicts the aggregate photocurrents of the A+, A−, B+, and B− regions as depicted in FIG. 3 over a span of time assuming a constant code wheel rotation rate (herein aggregate photocurrent is assumed to be directly proportional to aggregate illuminated area). As can be seen in FIG. 4, the photocurrent waveforms are periodic with period $1/(f_{CW}*PPR)$, where few is the rotational frequency of the code wheel and PPR is the order of rotational symmetry of the quadrature track of the code wheel. Moreover, the photocurrent waveforms are approximately sinusoidal and are in quadrature (i.e. equal in magnitude and separated in phase by 90°). The scheme depicted in FIG. 3, where the photoactive areas on the sensor IC alternate spatially between the A+, B+, A−, and B− regions and are closely matched in size and position to the geometries of the slits and bars in the quadrature track of the code wheel, is known as a phased-array design.

One problem of the existing encoder is that the very small dimensions of the code wheel and the wheel pattern permit minor mechanical alignment discrepancies to alter the light paths and, thus, adversely effect the accuracy of the detection of the modulated light. Consequently, the light path between the LED emitter and the optical sensor IC is sensitive to misalignments and require frequent calibration. For example, a misalignment between the optical sensor IC and a code wheel quadrature track may cause asymmetrical photoactive areas among A+, B+, A−, and B− regions, resulting in phase and magnitude errors in the corresponding photocurrent waveforms. In some applications, as an example, the maximum misalignment between an optical sensor IC and a code wheel should be less than about 1 micrometer (um). Some existing optical sensor ICs require a mechanical alignment as the system cannot easily compensate for misalignments. Thus, alignment adjustment or calibration of these components is generally cumbersome, time-consuming and imprecise.

Various embodiments address this challenge by remapping the pixel array to match the assembly orientation and offsets. In this example, a given pixel may be assigned to one of four regions (i.e., A+, B+, A−, and B− regions), and it is possible to recalculate an optimal pixel pattern for each unit assembly alignment by minimizing phase variation and/or amplitude variation among the regions for a multitude of pixel patterns representing assembly offsets.

A computer may be used to control the measurement system and to write pixel patterns into the encoder memory. The computer may have an interface to communicate with the encoder chip, e.g., $I_2C$ or similar, as well as an interface to the data acquisition equipment to take measurements.

The encoder system has a connector to allow the test system to access the analog signals from the encoder chip and to allow access to the communications port. The encoder system also contains a non-volatile memory or equivalent to store the resulting optimal pixel pattern. This memory can be on the encoder chip, on an external flash chip connected to the encoder, or on a microprocessor system connected to the encoder, or other appropriate place.

The host computer writes a series of pixel patterns and measures the results to determine an optimal setting. In one embodiment, the host starts with the pixel in a first position and measures the results. Next the host shifts in the y-direction, rewriting the pixels to match that Y orientation and measures the results. The value of the initial y-direction step could be obtained by the user's mechanical tolerance stackup analysis. The user would be able to identify where mechanical tolerances exist and add those together to get a maximum y-direction offset. Next, the host uses a similar negative y-direction (−Y) offset, writes the pattern and measure the result. This approach can then lead to a rapid binary search to determine the optimal y-direction position by picking the best from 0, +Y and −Y and using those as endpoints for a binary search.

Similarly, a search approach can be used in over the x-direction and also in the rotational plane. X and Y may be relatively computationally easy to determine since they represent linear shifts. However, in some instances, rotational alignment may employ more computation to determine an adjusted value as a rotated pattern and may have to be applied in conjunction with X and Y offsets. An expectation in some systems is that rotational misalignment would generally be a smaller factor than X and Y since rotational misalignment would include both X and Y skew and the geometry of the assembly mounting on most encoders limits this rotation.

Once an optimal pattern is found, it may be written by the host into the encoder system memory where it remains and is used by the encoder on powerup. This method may allow each unique encoder assembly to be calibrated for the specific alignment of that unit as it is mounted to an assembly. This may enable manufacturers to have a consistent product output with simplified labor in the factory. Examples of these systems and processes are explored in more detail with respect to FIGS. 5-13.

Figure 5:
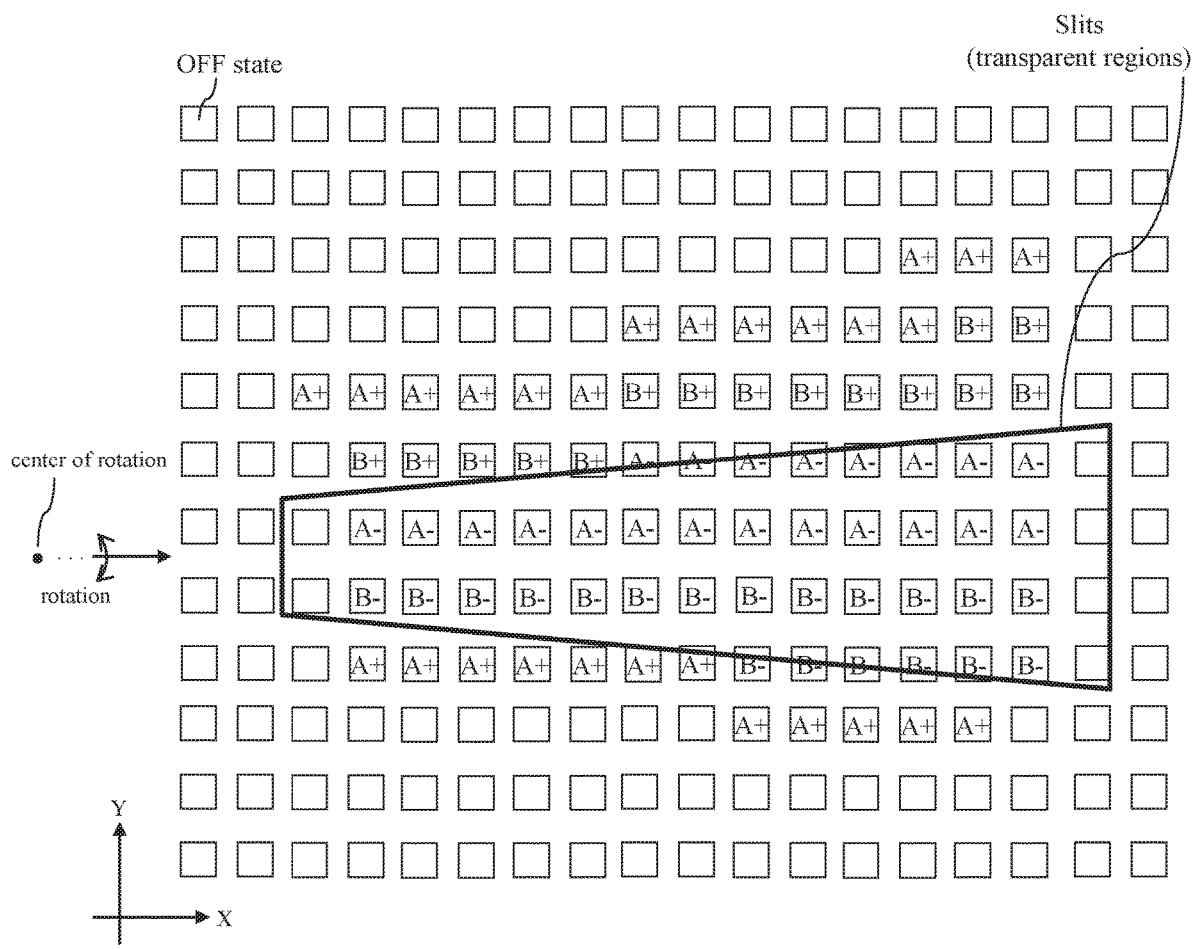
FIG. 5 illustrates an exemplary configurable photodetector array and configured quadrature assignments to photo pixels in the array, superimposed upon a code wheel's quadrature track, in accordance with some embodiments.

FIG. 5 illustrates a configurable photodetector array in an optical sensor IC and an example of configured quadrature assignments to each photodetector in the array, superimposed upon a code wheel's quadrature track which is in good alignment with the configurable photodetector array. The configurable photodetector array forms a photoactive area of the optical sensor IC. Each photodetector may include either a photodiode or a phototransistor. For simplicity, a photodetector in the array is also referred to as a photo pixel, or a pixel, and the configurable photodetector array is also referred to as pixel array. The photodetector in the illustrated embodiment is merely an example and is not intended to limit the present disclosure beyond what is explicitly recited in the claims. The principle of the present disclosure may also be applicable to a magnetic encoder. For example, a magnetic encoder system may have a configurable magnetic-field detector array to detect magnetic flux changes due to modulation from a moving object, such as a code wheel or a code stripe.

In an exemplary pixel array, each pixel can be configured to any one of the quadrature assignments (i.e., A+, A−, B+, B−) or an OFF state in which the pixel output is turned off. This configuration can be performed when the optical sensor IC is powered up by reading from a pixel partition map stored in a memory module, such as a non-volatile memory. The configuration may also be updated on-the-fly. The pixel partition map has a pixel pattern that represents a group of pixels assigned to non-OFF states (i.e., pixels in A+, B+, A−, and B− regions). In the illustrated example, the pixels on upper and lower rows of the pixel pattern are assigned as A+ according to a pixel partition map which fits a particular code wheel configuration. While when the optical sensor IC is installed with a different code wheel, individual ones of these pixels may change states to A−, B+, or B− to form a new pixel pattern that fits the new code wheel. Or, during an optical encoder operation, the system may determine to incrementally change the pixel partition map on-the-fly, and these particular pixels may be changed from A+ to A−, B+, or B−, together with some other pixels in the pixel array. Also, there can be more than one pixel array in one optical sensor IC. In some embodiments, one or more tracks of the code wheel are aligned to one or more pixel arrays.

A pixel array provides an advantage to enable the use of a single IC design for various code wheels. As a comparison, most existing optical encoder designs use a fixed pattern phased array for detectors, such pattern exactly matches a particular code wheel, thus limiting the array to a code wheel of specific size and PPR (pulse per revolution). This is because the geometry of the code wheel quadrature-track slits and bars changes if the code wheel configuration (radius and PPR) changes, and consequently a phased-array design intended for use with a particular code wheel configuration may not operate properly when used with a different code wheel configuration. For manufacturers that make many different encoder modules in low-to-moderate volume with configurations, this may necessitate the purchase of many different ICs in low-to-moderate volume. This results in a higher cost and more complex supply chain than would be needed if the same IC may be used for multiple encoder modules regardless of configuration. For example, if a user normally supports 3 code wheel radii and 4 different PPR per radii, then the user might maintain an inventory of 12 different ASICs (at least in theory). The principles in this disclosure would allow the user to inventory a single IC with a pixel array for a multitude of code wheel radii and PPR, generally allowing a lower cost position for the user due to higher volumes and reduced material handling. It is further to be shown in detail below that a pixel array also provides an advantage to enable an automatic alignment adjustment function.

Still referring to FIG. 5, in the illustrated embodiment, pixels configured with the same quadrature assignments form photoactive regions in proximity to a shape of a circular sector. In some embodiments, pixels configured with the same quadrature assignments form photoactive regions in strip shapes. In some other embodiments, the pixels configured with the same quadrature assignments form photoactive regions in mosaic shapes. The assignment of the pixels is typically a function of the code wheel's radius and PPR, and a pixel array's shape, pixel numbers, and spacing. In some embodiments, the consideration of pixel assignment also includes installation misalignments between the optical sensor IC and the code wheel. In furtherance of some embodiments, the consideration of pixel assignments includes correcting unbalanced currents or gains and phase errors such as due to installation misalignments.

A pixel array may have a rectangular shape, a square shape, or other suitable shapes. The shape of pixels may also be made non-homogeneous within the pixel array. Having different size/shape pixels may reduce total system noise. The rectangular, grid-based pixels may produce a small amount of noise compared with an ideally shaped detector that better matches the slit. Adjusting the shape to round, elliptical, or rounded corners may reduce overall noise. Further, changing the size of individual or groups of pixels may also improve system noise at the expected cost of increased layout complexity and increased modeling requirements to determine pixel mapping.

Figure 6:
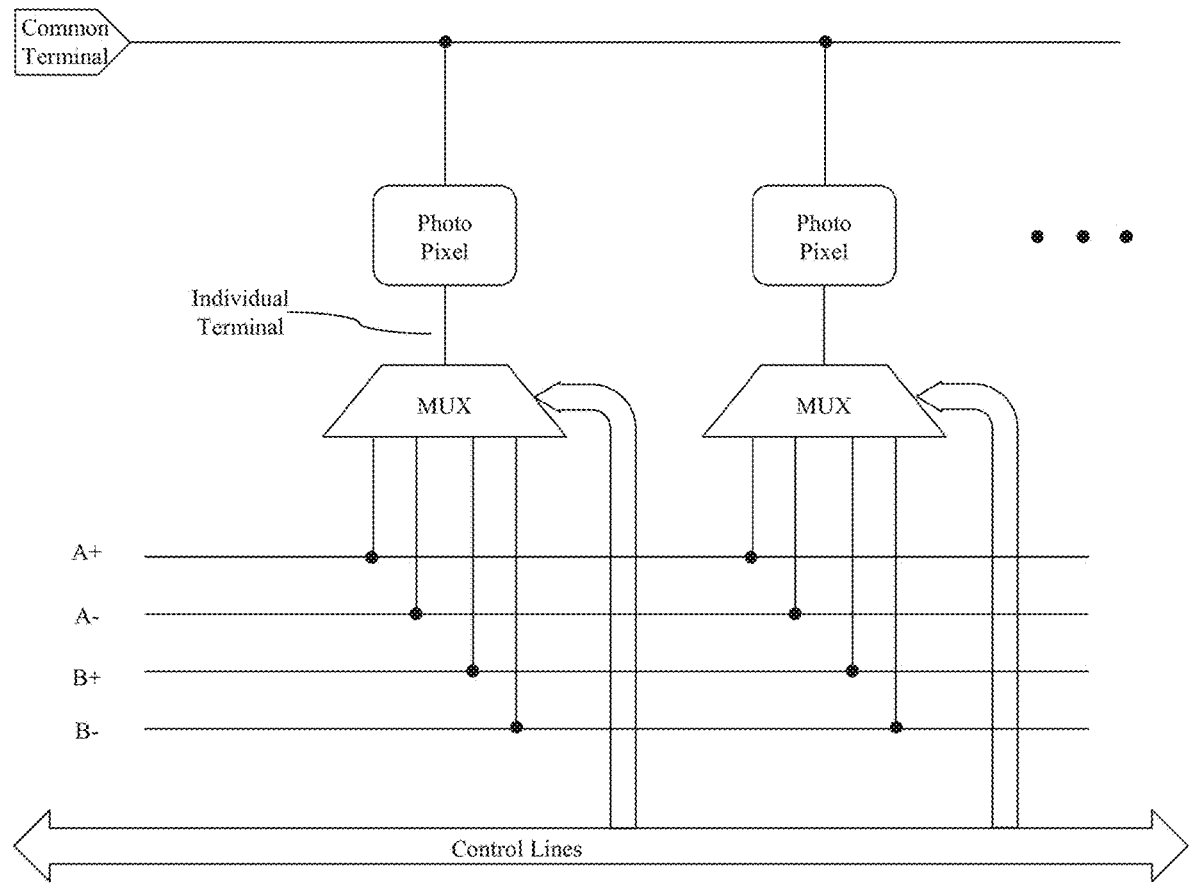
FIG. 6 shows an exemplary schematic of quadrature assignment mechanism to photo pixels in a configurable photodetector array, in accordance with some embodiments.

A pixel array may include a plurality of pixels and a plurality of lumped current-mode outputs. Referring to FIG. 6, each pixel includes a photoactive area with at least two electrical terminals, in which current flows between the first terminal (connected to all pixels in the array, also as common or ground terminal) and the second terminal (unique to each pixel, also as individual terminal) in proportion to the optical power incident to the photoactive area. The second terminal is coupled to an electrical switch (e.g., MUX). The electrical switch receives configuration bits from control lines (e.g., a bus line, or an SRAM word line) and routes the individual terminal of the photoactive area to one of the lumped current-mode outputs, no more than one of which is routed to the individual terminal at any given time. In this way, each lumped current-mode output carries current equal to the sum of the photocurrents in the photoactive areas of those pixels whose switches to that output are closed. One or more memory bits are used to select which electrical switch, if any, is to be closed, along with any circuitry and connections used to control the switches appropriately based on the states of the memory bits. For example, a pixel array may contain 64 rows by 32 columns of pixels, a total of 2048 pixels. Each pixel employs two bits (e.g., SRAM bits) to associate it to one of the four lump quadrature track assignments. As noted with respect to FIG. 6, each one of the lumped current mode out corresponds to a respective region (A+, A−, B+, B−). The system may use an 11-bit bus address to select a pixel, and an extra 2 bits to select one of the four lump quadrature track assignments.

The pixels in a pixel array may be partitioned among the various lumped current-mode outputs based upon the configuration of the code wheel. Partitioning may be performed by writing to the memory bits to control the switches. The pattern for the pixels is based on the design of the code wheel in the system. In an exemplary embodiment, a process of simulation or experimentation is used to determine the mapping for the pixels based on the code wheel radii and the slit pattern. The result is an initial partition map written into the memory of an ASIC to set each pixel to the correct region. It will further be shown the initial partition map is still subject to a partition map adjustment during an automatic alignment adjustment process before the encoder system is ready for regular operations.

In some embodiments, pixels can be set to an OFF state. An example solution sets each pixel to one of the 4 primary regions: A+, B+, A−, B−. It may be advantageous in some cases to turn individual pixels off. This may be performed pixel-by-pixel or based on entire rows or columns. This may allow the pixels to potentially more closely match the code wheel pattern. Further, this capability may allow better current balancing across the 4 main regions, simplifying the design of the downstream blocks in the ASIC like the transimpedance amplifiers (TIAs), filters, and comparators. One implementation to shut a pixel off is to add one more control bit to the MUX to select a status that none of the four lump current mode outputs are coupled to the individual terminal.

In some embodiments, pixels may be set to some intensity other than fully on. Normally pixels are fully on and assigned to one of 4 regions. Pixels may be set for partial intensity allowing a weighted current output, such as a half or quarter pixel to be used, or even zero (i.e., pixel is in OFF state) with extra one or more control bits. This weighted adjustment may potentially improve the mapping of pixels in a fixed pattern to the slits in a code wheel.

The lumped current outputs in this example are routed to transimpedance amplifiers (TIAs), such as four single ended TIAs or two differential TIAs. This is shown in more detail with respect to FIG. 7. These amplifiers convert the current output from the pixel array into voltage signals that can be used for downstream processing. These TIAs are sized appropriately for the current outputs from the 4 blocks. In an embodiment, The TIAs may be highly linear in order to produce high-quality analog outputs for the quadrature tracks. In another embodiment, the TIAs are logarithmic, in order to accommodate a wide dynamic range of input (e.g., when analog quadrature-track outputs aren't needed). The transimpedance should be large enough to keep the angular position error introduced by the amplifier's own internal noise and offset of downstream comparators small, yet small enough to preserve good linearity at full-scale input current. Each TIAs' instance may have an adjustable current sink additive to its input, for offset compensation. The current sink value for a particular instance may be controlled by a control byte corresponding to that instance. The adjustable current sink may include latches in which to store the control bit(s) (e.g., a byte).

Figure 7:
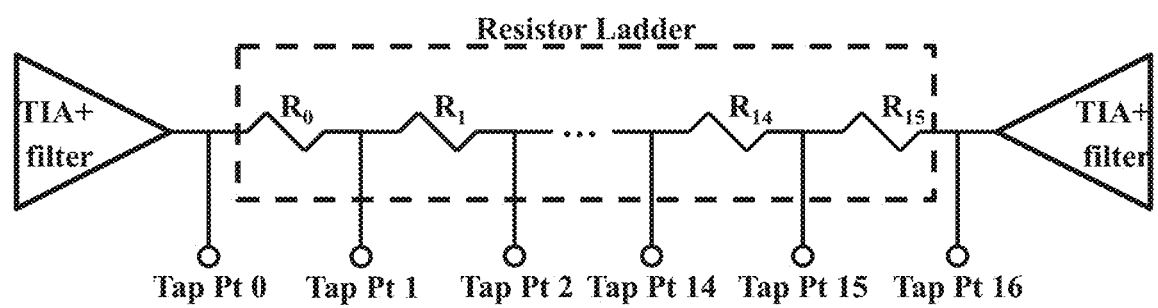
FIG. 7 shows an example circuit diagram of an example interpolator resistor ladder architecture that converts configurable photodetector array's readings into analog output with transimpedance amplifiers (TIAs), in accordance with an embodiment.

FIG. 7 shows a circuit diagram of an exemplary interpolator resistor ladder architecture that converts photodetector array readings into analog output with transimpedance amplifiers (TIAs). This is merely an example. Other suitable implementations, such as other suitable number of interpolator resistors (>2) and/or other suitable circuit topology, may also be used. In the illustrated embodiment, this block generates analog waveforms that are phase-shifted from the filtered A+/A−/B+/B− TIA output waveforms by between 0° and 90° in equal steps of 5.625° (=90°/16). By digitally comparing appropriate interpolated waveforms, square waves of up to 16× the frequency of the TIA outputs can be generated in this example. The block consists of four identical resistor ladders, each between the filtered outputs of two of the four quadrature-track TIAs (A+, A−, B+, B−): one between the B+ and A− filtered TIA outputs, one between the A− and B− filtered TIA outputs, one between the B− and A+ filtered TIA outputs, and the fourth between the A+ and B+ filtered TIA outputs. Various other embodiments may be scaled as appropriate to provide any number of steps.

Figure 8:
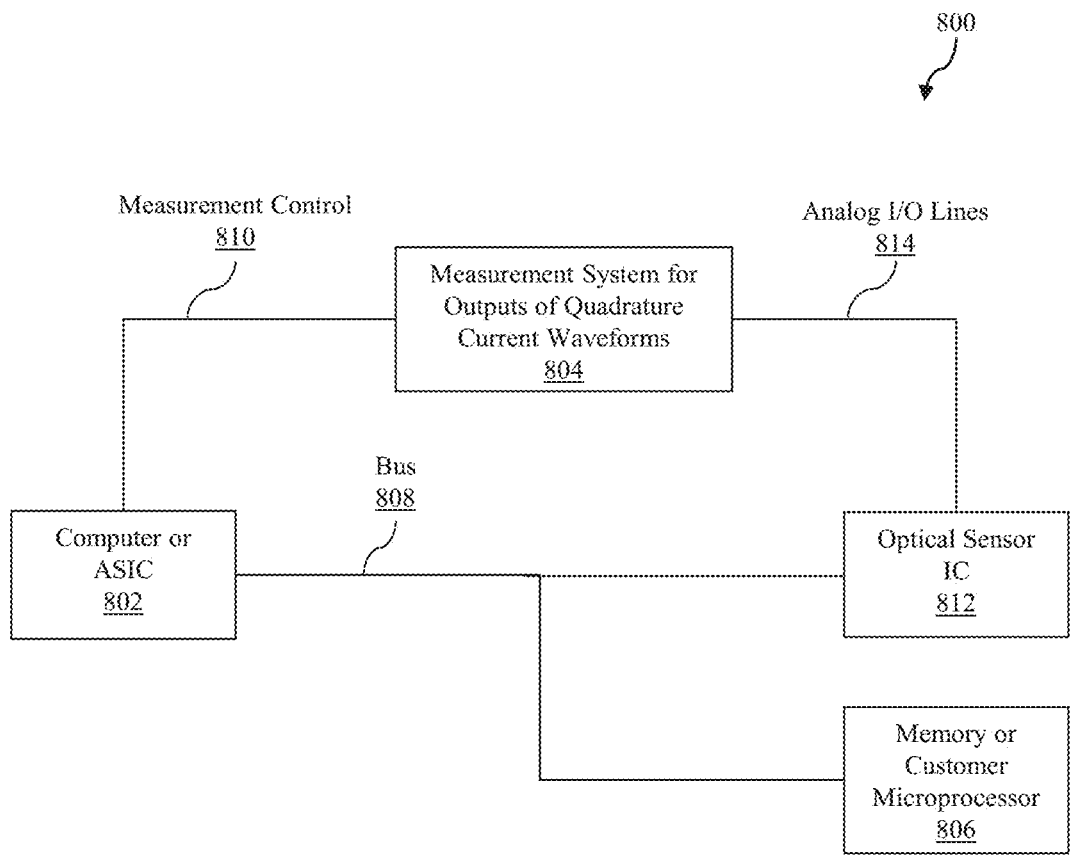
FIG. 8 illustrates a block diagram of an exemplary encoder system with automatic alignment adjustment function, in accordance with an embodiment.

In a practical system, the assembly of the printed circuit board containing the optical sensor IC may have some normal assembly tolerance. Mechanical clearance for mounting screws and the assembly capability of the entire system may also cause some natural misalignment of the entire system. The pixel array provides a solution to this challenge by remapping the pixel array to match the assembly orientations and offsets. Since each pixel can be assigned to one of the quadrature tracks or an OFF state, it is possible to recalculate an optimal pixel partition map fitting the assembly alignment. FIG. 8 illustrates a block diagram of an exemplary encoder system 800 with an alignment adjustment function. In FIG. 8, a computer or ASIC 802 is used to control a measurement system or a data acquisition equipment 804 and to read/write pixel partition maps from a memory 806, such as a random-access memory (RAM) or a non-volatile memory (NVM), or from other equivalent circuits (e.g., a user microprocessor). The computer or ASIC 802 has an interface 808 to talk to the encoder chip, such as a I2C bus or other suitable buses, as well as an interface 810 to the data acquisition equipment 804 to take measurements.

The optical sensor IC 812 contains a connector to allow the test system to access the analog signals through analog I/O lines 814 and to allow access to the communication ports. The optical sensor IC 812 also couples to the memory to read the resulting optimal pixel pattern. This memory can be on the optical sensor IC, on an external flash chip connected to the IC, on a microprocessor system connected to the IC, or other appropriate place.

The computer or ASIC 802 generates a series of pixel patterns and sends them one at a time to the optical sensor IC 812. The computer or ASIC 802 then measures the results corresponding to the series of pixel patterns to determine an optimal pixel pattern which has the smallest misalignment of any of the pixel patterns of the series. Misalignment may be manifest in phase or magnitude errors, so various embodiments may measure phase relationships between the regions as well as magnitude variations between the regions and compare results between pixel patterns. Pixel patterns having phase relationships closest to 90 degrees and having smallest magnitude variations among the regions may be considered to have a smallest misalignment of the pixel patterns. However, some embodiments may weigh one parameter more than the other, so that phase variation may be given more importance than magnitude variation, or vice versa. In any event, various embodiments seek to minimize phase variation and/or magnitude variation among the regions, using any appropriate algorithm.

In some embodiments, the series of pixel patterns may be a pre-determined set of pixel patterns stored in the memory. In some embodiments, the series of pixel patterns may be generated by linearly shifting an initial pixel pattern along a certain direction, such as along a direction parallel to a polar axis of a code wheel (e.g., x-direction in FIG. 5), or along a direction perpendicular to a polar axis of the code wheel (e.g., y-direction in FIG. 5). In some embodiments, the series of pixel patterns may be generated by rotating the initial pixel pattern. In some scenarios, the pixel patterns could be computed in advance of testing for maximum manufacturing speed since the geometry of the pattern is based on the target code wheel and is known ahead of manufacturing.

Once an optimal pixel pattern is identified, it is written into the memory or user microprocessor where it remains and is used by the optical sensor IC on future powerups. This method allows each unique encoder assembly to be calibrated for the specific alignment of that unit. This method also enables manufacturers to have a consistent product output with simplified labor in the factory.

Figure 9A:
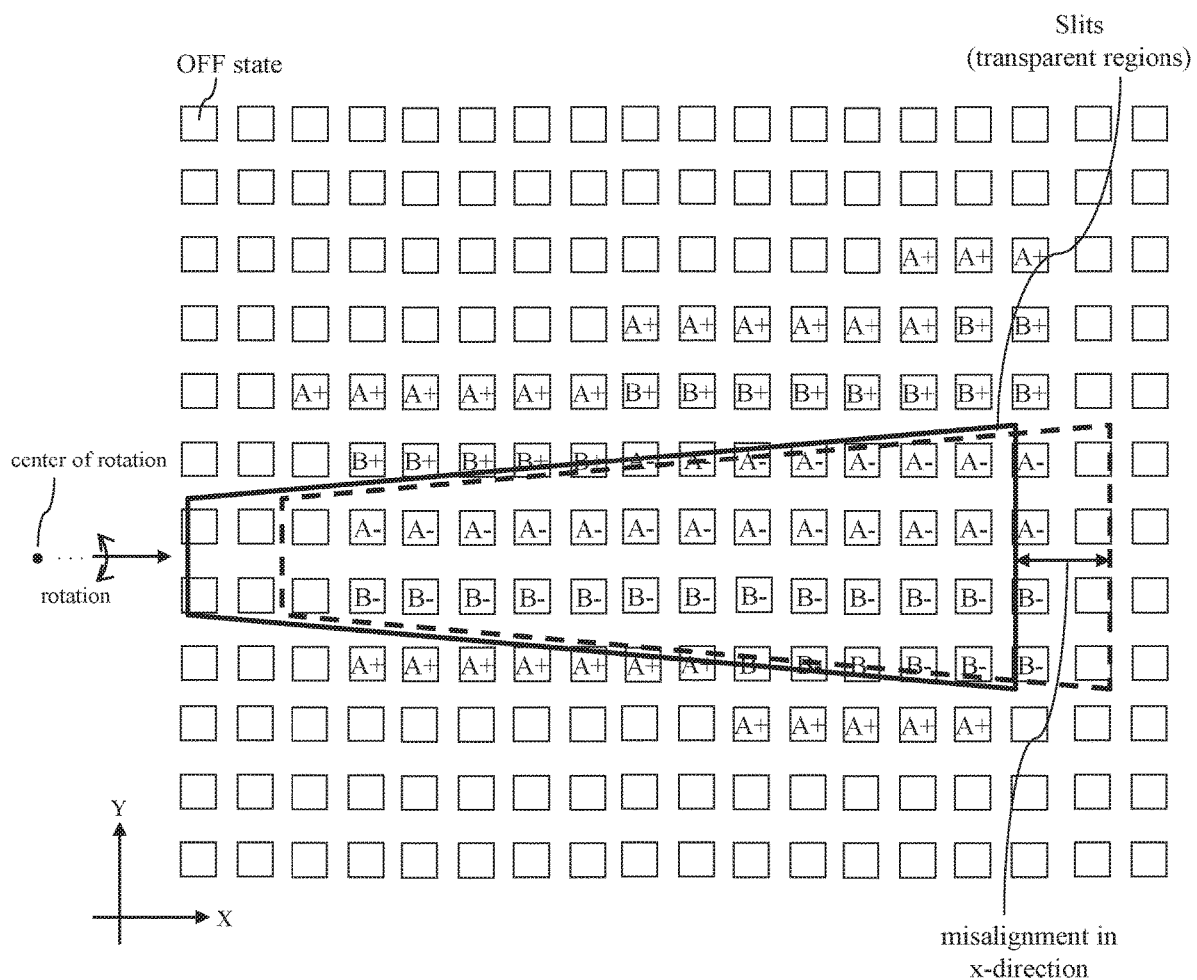
FIGS. 9A and 9B illustrate an example of a misalignment along the x-direction between a configurable photodetector array and a code wheel and corresponding pixel partition map adjustment for the configurable photodetector array to mitigate the misalignment, in accordance with some embodiments.

FIG. 9A illustrates a misalignment along the x-direction between a pixel array and a code wheel. Compared with FIG. 5, the pixel array is assigned with the same pixel partition map after the encoder system is powered up, which is also referred to as an initial partition map. The difference is that the quadrature track in FIG. 5 (also marked as dotted box in FIG. 9A) matches the pixel pattern in the initial partition map, as the pixels with certain quadrature assignments are centered within the quadrature boundary and do not overlap significantly with other quad tracks, while the quadrature track in FIG. 6 shifts a certain distance along the negative x-direction. Due to the shifting, some pixels on the right edge are left outside of the quadrature boundary, which creates asymmetry among four quadrature regions. By observing current waveforms generated by each quadrature region, one may notice the phase difference between two adjacent waveforms is no longer well maintained at approximately 90°, which may become 95° or worse in a specific example. Also, the magnitudes of current waveforms may no longer be balanced. Residual currents of a sum of A+ region and A− region, or a sum of B+ region and B− region may become larger than zero.

In some embodiments, during an alignment adjustment process, the system shown in FIG. 8 will first shift the pixel pattern in the initial partition map along the the x-direction to look for a new optimal position. The shifting is done by rewriting the pixels to recreate the same pixel pattern but offset in the x-direction. The shifting of the pixel pattern in the initial partition map is also termed the shifting of the partition map for simplicity. In this example, the encoder system starts by shifting in the x-direction instead of the y-direction because the x-direction aligns with the polar axis of the code wheel and the y-direction is perpendicular to the polar axis. The inventors of the present disclosure have discovered an encoder system is more sensitive to a misalignment occurred along polar axis than along other directions. Thus, the system may determine a maximum offset in the x-direction, such as X pixels (e.g., 8 pixels). The user would be able to identify where mechanical tolerances exist, thus the maximum offset may be obtained by the user's mechanical tolerance stackup analysis. In one embodiment, the encoder system sweeps one pixel offset at a time ranging from the maximum negative offset −X pixels to the maximum positive offset+X pixels, and recording benchmarks for each offset. Then the system compares the recorded benchmarks of the different offsets (e.g., current waveform phases and magnitudes) to determine an optimal offset value that minimizes misalignment.

Figure 9B:
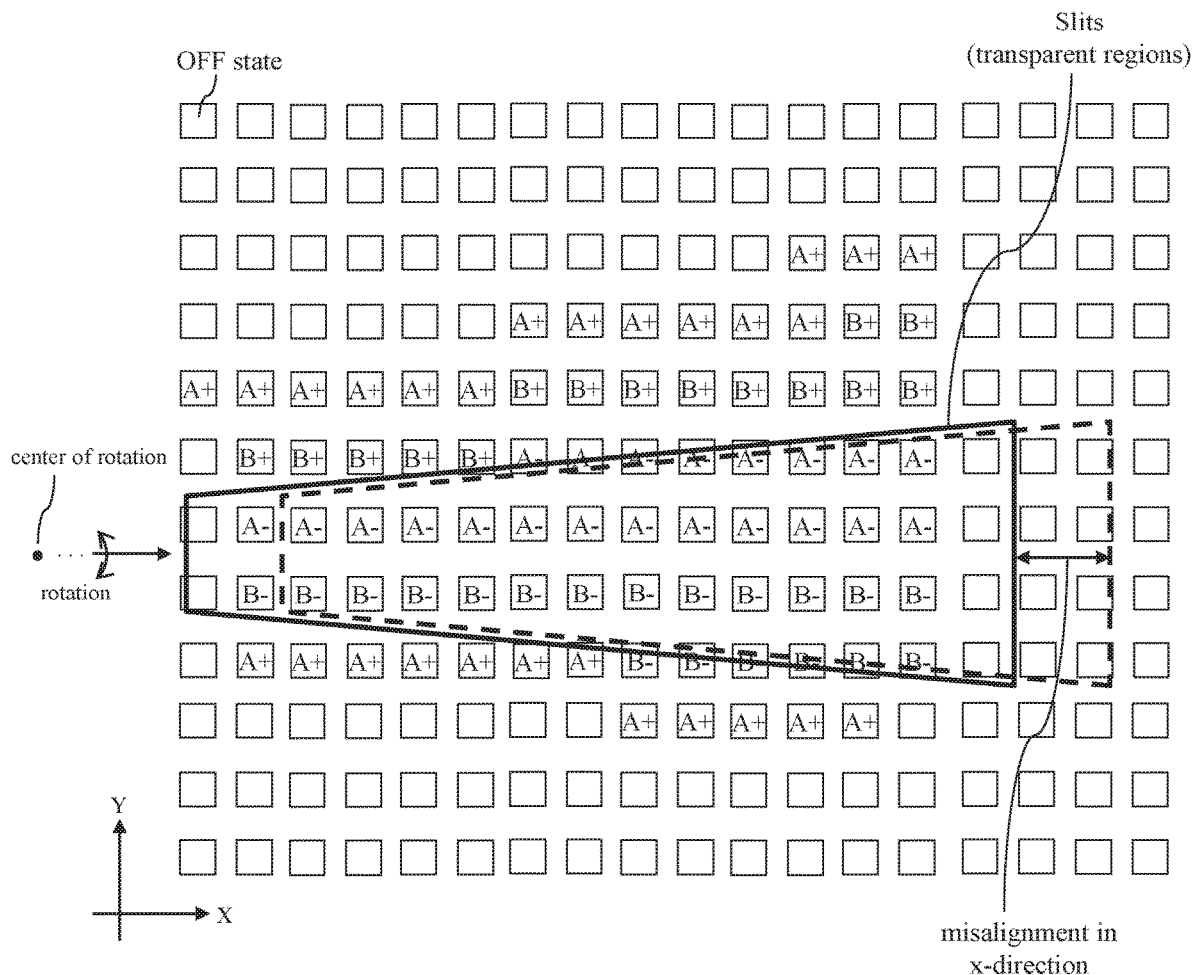

Other than sweeping through all the offset settings, other techniques could be used to perform the measurement and seeking an optimal offset value in a rapid fashion, such as applying a binary search algorithm. A binary search may be generally efficient for fixed-size problem sets. Further the binary search approach would allow pre-computation of pixel patterns for fastest implementation. In one such embodiment, the encoder system uses a binary search algorithm to determine an optimal offset. In a binary search, the system starts with comparing results measured at offset values of −X pixels, 0 pixel, +X pixels, respectively. If an offset of +X pixels yields the best result, the system then proceeds to compare results measured at offset values of +X pixels, +X/2 pixels, 0 pixel, and continue this binary search process until an optimal offset is found. A shifted pixel pattern with an optimal offset found by the encoder system is illustrated in FIG. 9B, where the initial partition map is linearly shifted along the negative x-direction for 2 pixels.

Figure 10A:
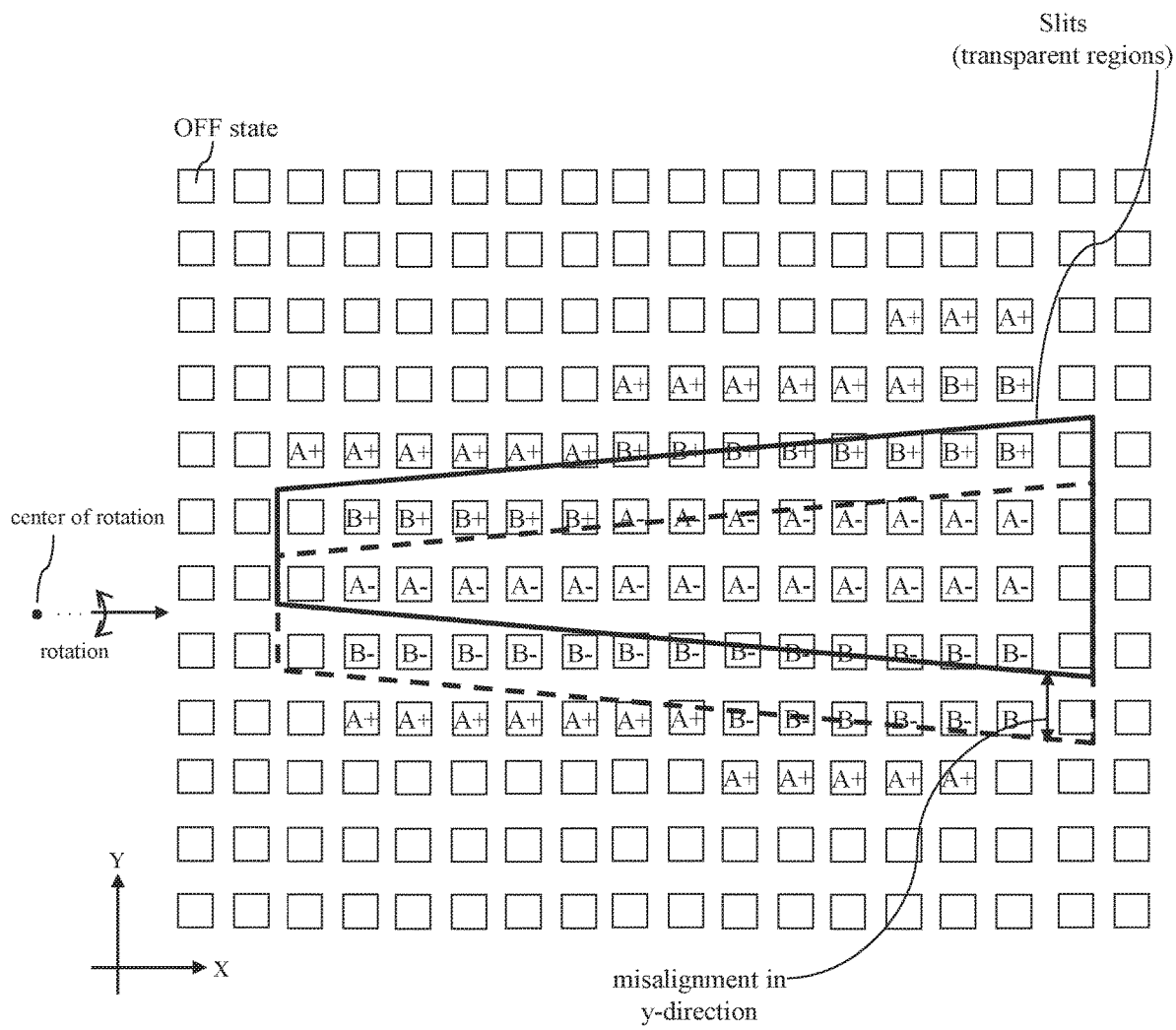
FIGS. 10A and 10B illustrate an example of a misalignment along the y-direction between a configurable photodetector array and a code wheel and corresponding pixel partition map adjustment for the configurable photodetector array to mitigate the misalignment, in accordance with some embodiments.
Figure 10B:
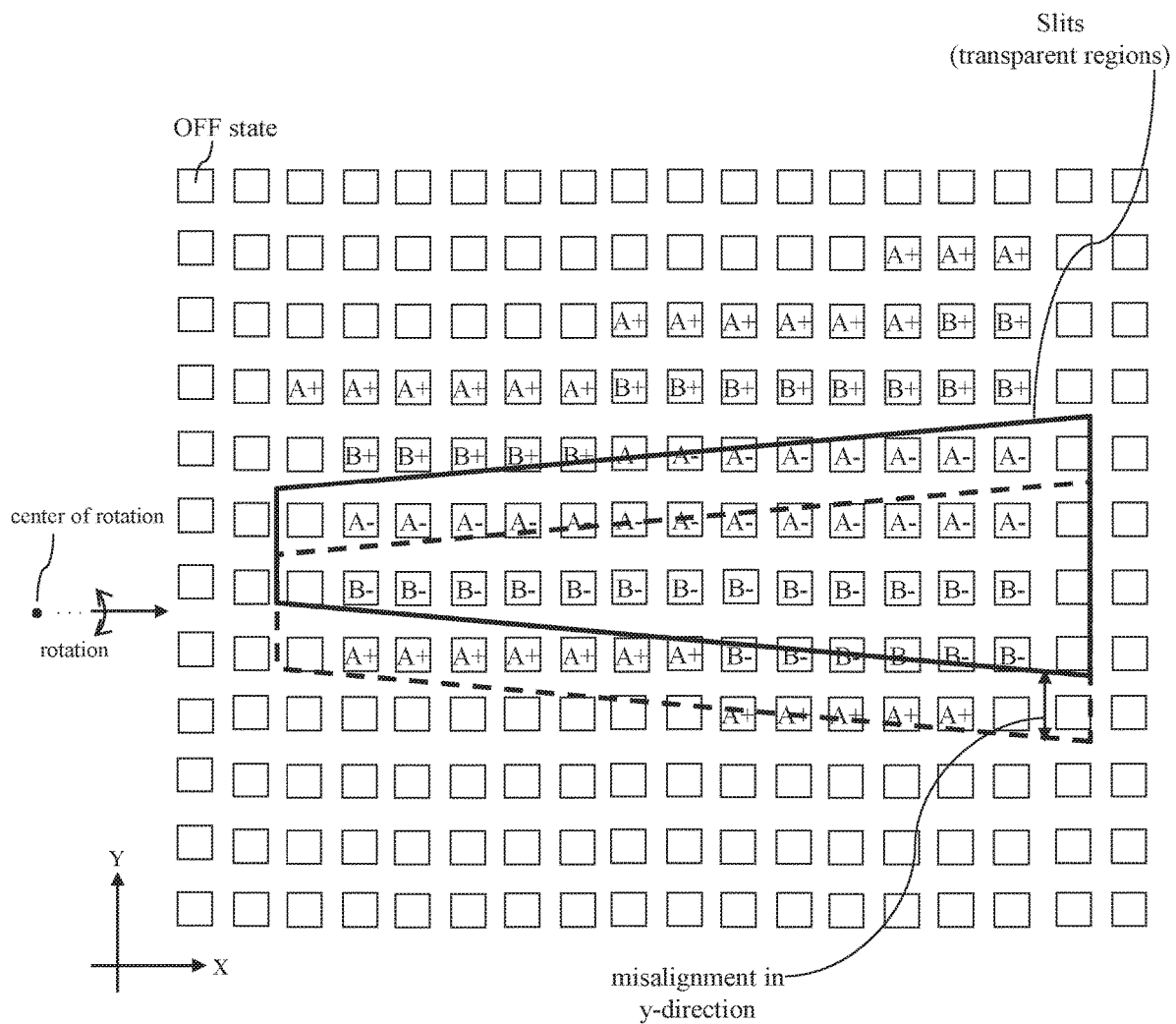

FIG. 10A illustrates a misalignment along the y-direction. The encoder system may use a search approach similar to the one used in the x-direction. The encoder system may determine a maximum offset equals Y pixels (e.g., 8 pixels), then use either sweeping through offsets ranging from −Y pixels to +Y pixels or through a binary search. A shifted pixel pattern with an optimal offset found by the encoder system is illustrated in FIG. 10B, where the initial partition map is linearly shifted along the positive y-direction for 1 pixel.

Rotational alignment requires more computation to determine an adjusted value as a rotated pattern may have to be applied in conjunction with X and Y offsets. The expectation is that rotational misalignment would be a smaller factor than X and Y offsets, since rotational misalignment would require both x-direction and y-direction skews and the geometry of the optical detector IC mounting on most encoders limits this rotation. In one embodiment, a rotational alignment is performed after the linear shifting (along either the x-direction or the y-direction) has been completed. Put another way, some embodiments may perform an alignment process starting with an offset most correlated with errors (e.g., the x-direction). Once an optimal offset is found for that direction, the process moves to a next directional offset.

Figure 11:
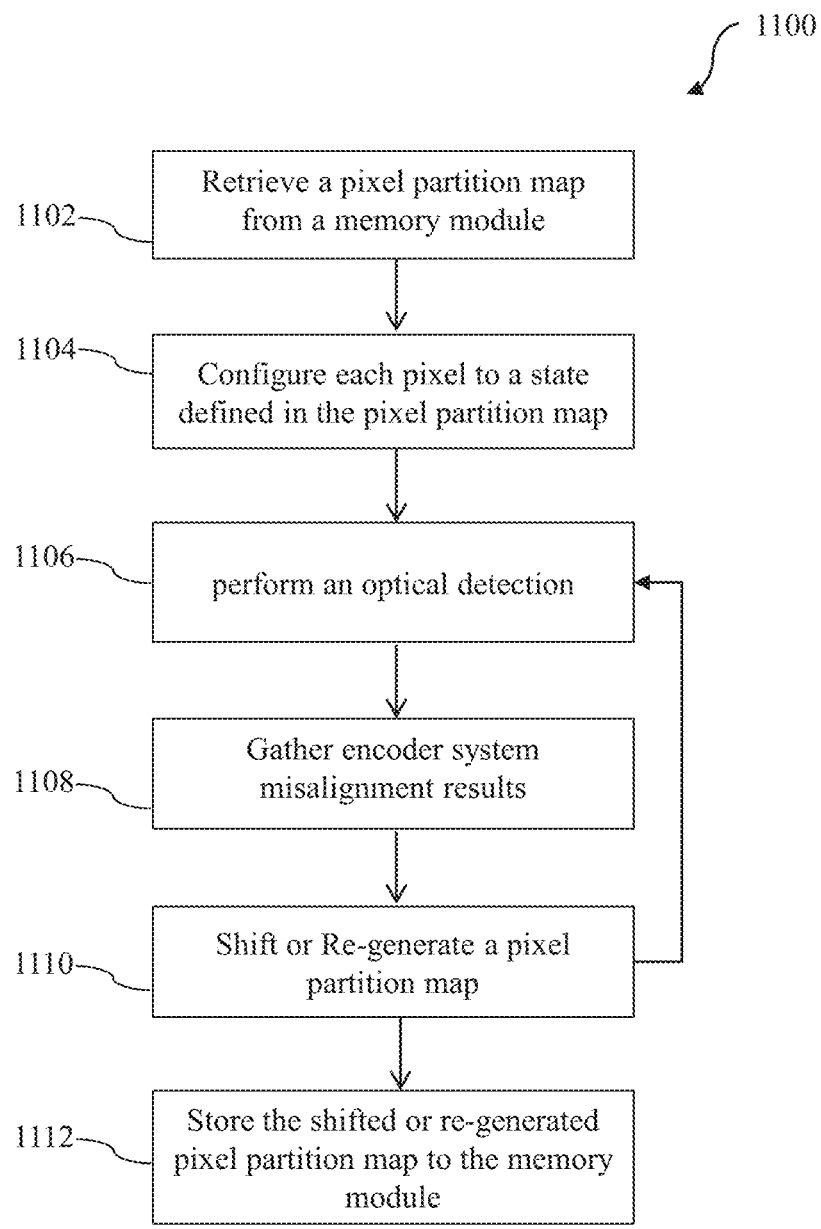
FIG. 11 shows a flowchart of an exemplary method of adjusting a pixel partition map to mitigate apparatus misalignment in an encoder system, in accordance with some embodiments.

FIG. 11 shows a flow chart of an exemplary method 1100 to adjusting an initial pixel partition map for configuring the pixel array in an alignment adjustment process. A physically separate computer system (e.g., a PC) and/or other microcontroller unit(s) (e.g., an ASIC) may execute the operations of method 1100 by reading codes from a computer-readable medium and executing the codes to provide the functionality discussed herein. At operation 1102, the optical sensor IC retrieves an initial pixel partition map from a memory module after a power up. In an embodiment, the optical sensor IC may run an internal state machine that reads an external non-volatile memory to load the pixel partition map. At operation 1104, each pixel in the pixel array is configured to a state defined in the pixel partition map, for example the map defines each individual pixel into one of the four quadrature regions discussed above or an OFF state. For example, control signals may be applied to switches (e.g., multiplexors of FIG. 6) to couple each pixel with a respective current line. At operation 1106, the optical encoder performs an optical detection, by collecting currents from different assigned quadrature regions on the pixel array in response to a light emitter that is modulated by a moving object, such as code slits rotating around a linear axis or sliding up/down a linear strip. At operation 1108, the system records misalignment results, such as a joint consideration of phase differences between adjacent quadrature current waveforms and current magnitude balance. At operation 1110, the encoder system shifts the partition map to examine whether the misalignment results are improved.

In some embodiments, the shifting includes a linear shifting, that is to shift the partition map along the x-direction or the y-direction. For example, the system will first perform a shifting in the x-direction then followed by a shifting in the y-direction with the offset in the x-direction fixed. In some embodiments, the shifting is a rotation of the partition map. In some embodiments, the shifting includes a linear shifting along the x-direction or the y-direction or both, then followed by a rotation. In some embodiments, the system re-generates a partition map which may have a different pixel pattern than the one in the initial partition map. After operation 1110, the method 1100 may return to operation 1106 in an iteration to check the misalignment results of the adjusted (e.g., shifted or re-generated) partition map and repeats operations 1108 and 1110. The iteration may include a sweeping process that examines each offset setting between maximum offset ranges or by applying a binary search algorithm. In some embodiments, the iteration examines a pre-determined series of partition patterns already stored in the memory. Once a shifted or re-generated partition map is identified as the optimal partition map, which corresponds to minimum misalignment results, the optimal partition map is stored in the memory at operation 1112. The optimal partition map may be used as the default partition map in future startups of the encoder system. Subsequently, the configurable pixel array is configured based on the optimal partition map and the encoder system is ready for regular operation.

Figure 12:
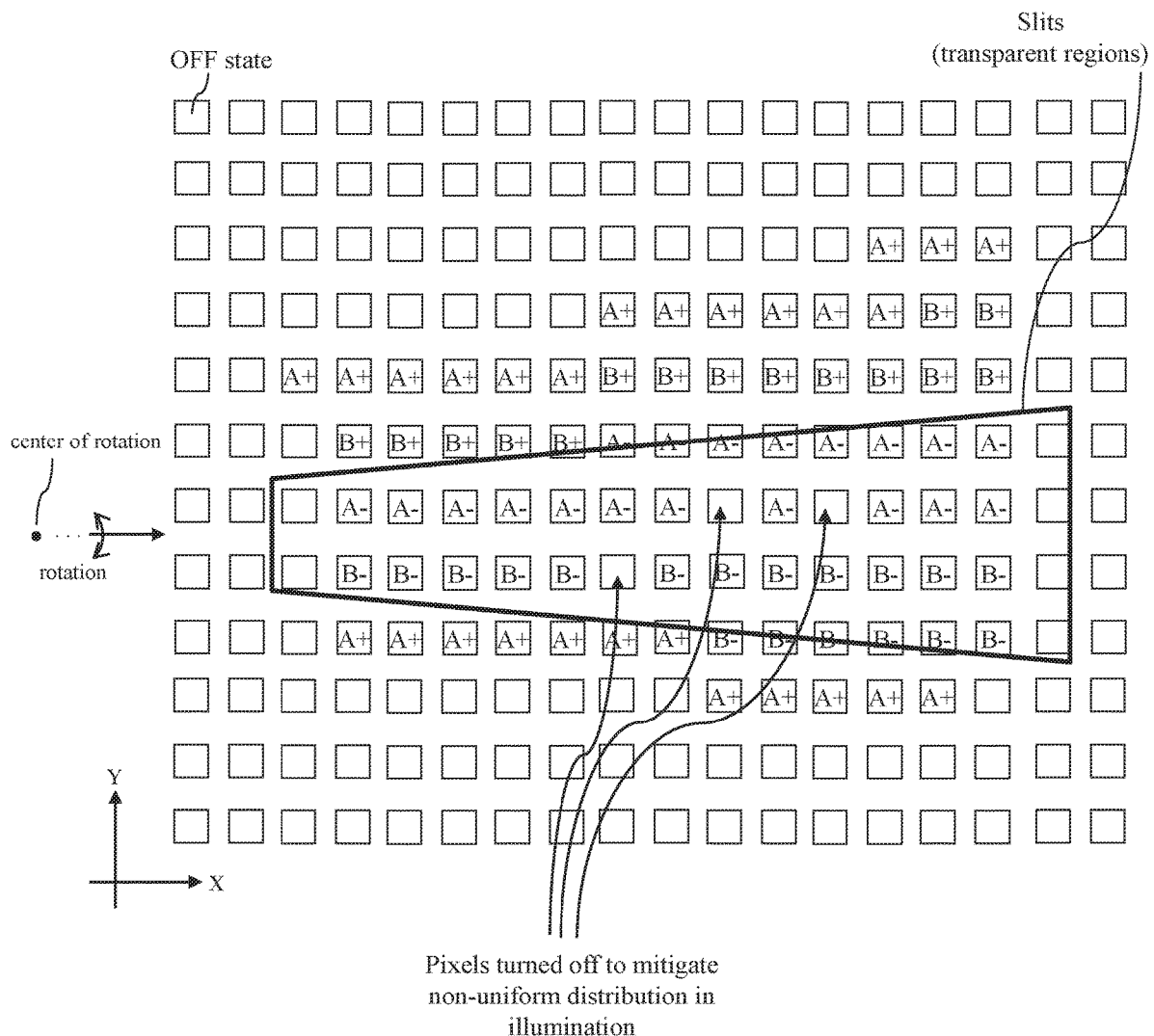
FIG. 12 shows an exemplary configuration for a configurable photodetector array with some photodetectors assigned to OFF state to mitigate light intensity non-uniformity during a pixel partition map adjustment process, in accordance with some embodiments.

Using a pixel array in an encoder system also allows an alignment adjustment process to first map a light intensity profile from the light source and then use the result to fine tune a partition map during the alignment adjustment. In the ideal case, the light source (e.g., a LED) in the encoder system would provide a uniform light intensity for the diameter of the light source. In actual designs, the light source often exhibits a non-uniform light intensity distribution with rolloff on the side and a non-flat top of the light source. In some embodiments, the light intensity profile fits a Gaussian distribution. The alignment process may first map light intensity by programming blocks of pixels and measuring the corresponding current output to obtain an intensity profile map. This map would then be overlaid on the pixel pattern during alignment adjustment to turn on or off more pixels to provide a uniform signal intensity for each of the quadrature channels. For example, an LED may have a higher output stripe near one quad grouping, such that one quadrature region could be gained down compared with other quadrature regions by selecting fewer pixels by setting one or more pixels to OFF state, or by using an analog technique such as assigning a weight (e.g., <1 for less gain or >1 for higher gain) to currents generated by one or more pixels in the corresponding quadrature region. FIG. 12 illustrates an exemplary partition map after fine tuning for mitigating light intensity non-uniformity. In this example, a light intensity profile map may reveal that light intensity is stronger in quadrature regions A− and B− than in regions A+ and B+. Subsequently, the system calculates a fine-tuned partition map in which two pixels in A− region and one pixel in B− region are set to OFF state. Later on, the system may use this fine-tuned partition map as an initial map for a shifting or re-generating operation in subsequent alignment adjustment process.

Figure 13:
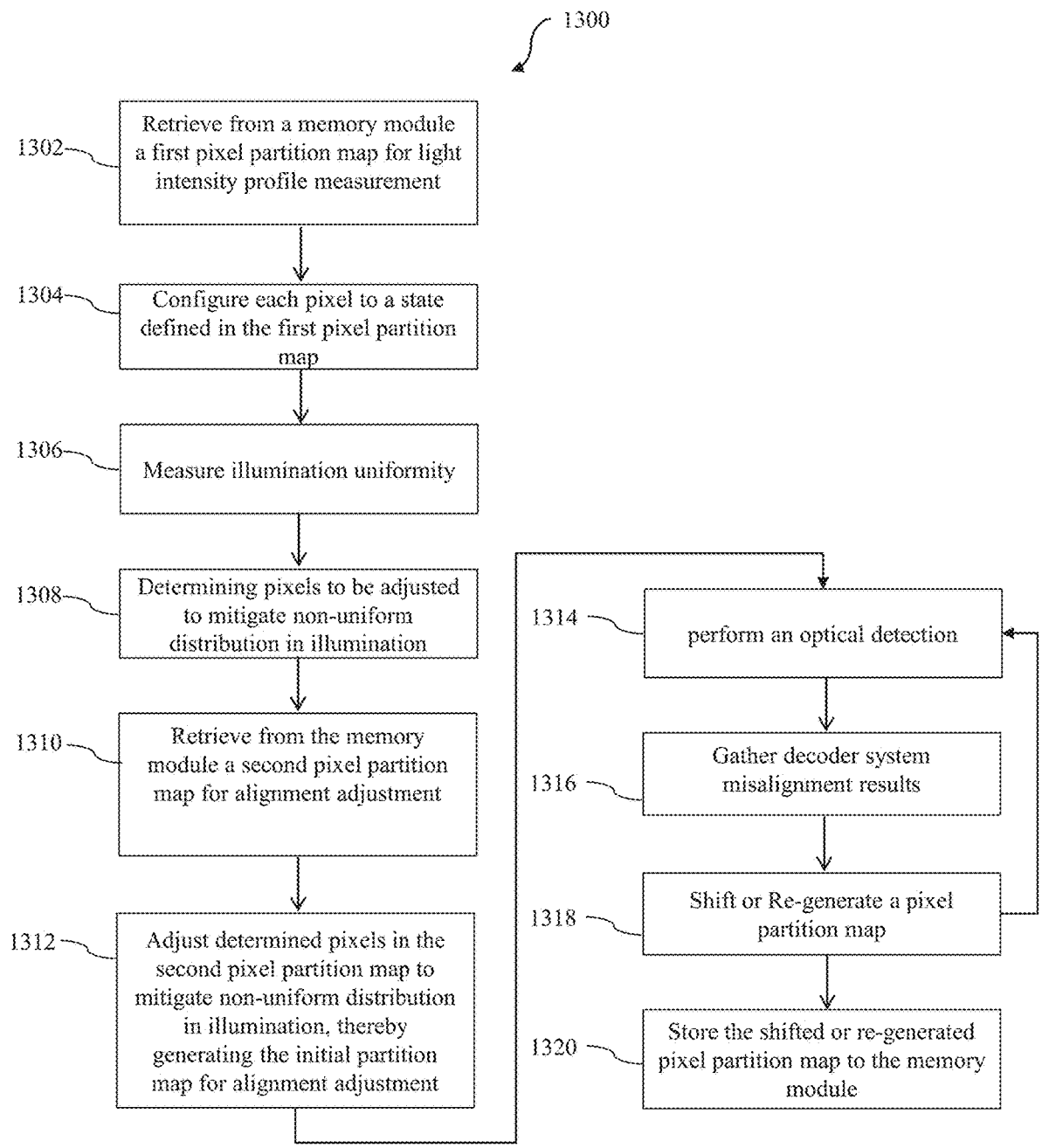
FIG. 13 shows a flowchart of an exemplary method of adjusting a pixel partition map to mitigate light intensity non-uniformity and apparatus misalignment in an encoder system, in accordance with some embodiments.

FIG. 13 shows a flow chart of an exemplary method 1300 that combines the light intensity non-uniformity compensation and the alignment adjustment. Multiple operations in the method 1300 may be similar to those in method 1100, which will be described briefly for simplicity. A physically separate computer system (e.g., a PC) and/or other microcontroller unit(s) may execute the operations of method 1300 by reading codes from a computer-readable medium and executing the codes to provide the functionality discussed herein. At operation 1302, the optical encoder retrieves a first pixel partition map from a memory module after a power up. In some embodiments, the first pixel partition map is different from the one used later on at operation 1310 for alignment adjustment purpose. In some embodiments, the first pixel partition map is the same with the one used later on at operation 1310 for alignment adjustment purpose. In an embodiment, the optical sensor IC may run an internal state machine that reads an external non-volatile memory to load the map. At operation 1304, each pixel in the pixel array is configured to a state defined in the first pixel partition map, for example the map defines each individual pixel into one of the four quadrature regions discussed above or an OFF state. For example, control signals may be applied to switches (e.g., multiplexors of FIG. 6) to couple each pixel with a respective current line. At operation 1306, the light intensity profile from the light source is measured by the pixel array. At operation 1308, based on the measured light intensity profiled, one or more pixels are determined to be adjusted to mitigate non-uniform distribution in the illumination. The adjustment may include set the selected pixels to OFF state (to reduce gain) or non-OFF state (to increase gain) or change weights assigned to the currents corresponding to the selected pixels. At operation 1310, the optical encoder retrieves a second pixel partition map from the memory module. The second pixel partition map corresponds to the quadrature tracks on a code wheel and will be used for alignment adjustment.

At operation 1312, the pixels selected at operation 1308 is adjusted. As discussed above, the adjustment may include set the selected pixels to OFF state (to reduce gain) or non-OFF state (to increase gain) or change weights assigned to the currents corresponding to the selected pixels. After adjusting the selected pixels, the second pixel partition map is considered as the initial partition map in method 1100 for alignment adjustment process, such as for shifting or re-generation operations. At operation 1314, the optical encoder performs an optical detection based on the initial partition map, by collecting currents from different assigned regions on the pixel array in response to a light emitter that is modulated by a moving object, such as code slits rotating around a linear axis or sliding up/down a linear strip. At operation 1316, the system records misalignment results, such as a joint consideration of phase differences between adjacent quadrature current waveforms and current magnitude balance. At operation 1318, the system shifts the partition map to examine whether the misalignment results are improved. In some embodiments, the shifting is a linear shifting, that is to shift the partition map along the x-direction or the y-direction. For example, the system will first perform a shifting in the x-direction then followed by a shift in the y-direction with the offset in the x-direction fixed. In some embodiments, the shifting includes a rotation of the partition maps. In some embodiments, the shifting includes a linear shifting along the x-direction or the y-direction or both, then followed by a rotation. In some embodiments, the system re-generates a partition map which may have a different pixel pattern than the one in the initial partition map. After operation 1318, the method 1300 may return to operation 1314 in an iteration to check the misalignment results of the adjusted (e.g., shifted or re-generated) partition map and repeats operations 1316 and 1318. The iteration may include a sweeping process that examines each offset setting between maximum offset ranges or by applying a binary search algorithm. In some embodiments, the iteration is to examine a pre-determined series of partition patterns already stored in the memory module. Once a shifted or re-generated partition map is identified as the optimal partition map, which corresponds to minimum misalignment results, the optimal partition map is stored in the memory module at operation 1320. The optimal partition map may be used as the default partition map in future startups of the encoder system. Subsequently, the pixel array is configured based on the optimal partition map and the encoder system is ready for regular operations.

The optical encoder in the present disclosure may be adapted for use in both transmissive and reflective architectures. The description here is for a transmissive design where the LED is on one side of the code wheel and the detector is on the other. In a reflective design, the LED sits on the same side with the detector IC, either on-chip or off-chip with the detector IC, and reflects light off the code wheel with reflective "slits" and non-reflective spaces. This may provide a smaller system design. The pixel array supports both transmissive and reflective architectures. In an exemplary reflective design, the LED is on the same die with the detector IC. In another exemplary reflective design, the LED and the detector IC are on two separate devices (e.g., two dies) but physically assembled together.

The concept can be applied to linear encoders as well as rotary. In a linear design, the equivalent of code slits would be on a linear axis and slide up/down the pixel array. The pixel array would work equally well in that scenario. For example, in a linear encoder embodiment the motion object may include pulses-per-length, as opposed to a rotary encoder that uses radius and PPR.

The pixels may be constructed with configurations accessed either from a random-access memory (RAM) or from a non-volatile memory (NVM). In the case of RAM, a host microcontroller may set each memory. Alternatively, the encoder ASIC may contain logic to read from an external NVM or an internal NVM and set the memory that way. Internal NVM may be programmable—i.e., flash, or may be a one-time-programmable memory. The pixels may also be set using a read-only memory (ROM) to store static pattern although that reduces the advantage of user flexibility. Users with sufficient volume may order a ROM pattern to eliminate the need to configure the memory at run time.

In various embodiments, the pixel array may have configurable pixels that may be set by a memory to map to one of the four channels. The configurable pixels may be set either by a host microcontroller, using an internal non-volatile memory with a circuit to read and set, or by using a masked ROM where the pixels are set in some factory alignment configuration. However, various embodiments may use any appropriate processor or memory. Furthermore, in-system configurability is possible for some embodiments. Encoder manufacturers may apply a patch in the field, updating the pixel map after the product has been installed in the field. This patch may improve or otherwise change performance characteristics.

Also, the lack of a visible phased-array pattern makes the design less susceptible to cloning. Traditionally, a regular phased-array can be observed under a microscope to determine size of features thus allowing a competitor to copy the design. The pixel array does not have any indication of mapping thus requiring the $I^2C$ or other protocol stream to be interrupted in order to determine which pixels are mapped to which quadrature region. This would be considerably more difficult to copy.

Moreover, the configurable pixel arrays may also allow a user to use same IC to develop a product portfolio of difference performance levels, for example by setting different thresholds to limit an optical encoder's precision level. Therefore, encoder manufacturers may provide different performance/price points with a common set of hardware including code wheel. Remapping the pixel array with a common code wheel may allow different performance of the resulting system. Encoder manufacturers may offer higher or lower price points based on performance with identical hardware thus allowing them to market their products differently.

The principle of the present disclosure may also be applicable to a magnetic encoder as to an optical encoder. For example, in a magnetic encoder, instead of a configurable photodetector array including a plurality of photodetectors, the system may have a configurable magnetic-field detector array including a plurality of magnetic detectors. A magnetized part in the emitter generates a magnetic flux. The configurable magnetic-field detector detects changes of the magnetic flux modulated by the moving object, such as a code wheel or a code stripe. The other aspects of the magnetic encoder are similar to what have been described above in the optical encoder and omitted here for the sake of simplicity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method performed on a configurable encoder system having a pixel array, the method comprising:
   writing a first pixel pattern to the pixel array and measuring phase variation or amplitude variation among groups of pixels in the first pixel pattern;
   writing a second pixel pattern to the pixel array and measuring phase variation or amplitude variation among groups of pixels in the second pixel pattern, the second pixel pattern having a spatial offset from the first pixel pattern;
   comparing the phase variation or amplitude variation of the first pixel pattern to the phase variation or amplitude variation of the second pixel pattern;
   selecting one of the first pixel pattern or the second pixel pattern based on the comparing; and
   storing the selected one of the first pixel pattern or the second pixel pattern to a memory device that is in communication with a controller of the configurable encoder system in a location of the memory device to be accessed by the controller upon startup of the configurable encoder system.

2. The method of claim 1, wherein the spatial offset comprises an x-direction offset.

3. The method of claim 1, wherein the spatial offset comprises a y-direction offset.

4. The method of claim 1, wherein the spatial offset comprises a rotational offset.

5. A method performed on a configurable encoder system having a pixel array, the method comprising:
   adjusting a pixel pattern by comparing phase variation or amplitude variation for a first plurality of pixel array mappings over a first set of spatial offsets and selecting a first pixel array mapping from the first plurality of pixel array mappings, based on comparing phase variation or amplitude variation;
   further adjusting the pixel pattern by comparing phase variation or amplitude variation for a second plurality of pixel array mappings over a second set of spatial offsets and selecting a second pixel array mapping from the second plurality of pixel array mappings, based on comparing phase variation or amplitude variation; and
   after selecting the first and second pixel array mappings, storing the adjusted pixel pattern to a memory device that is in communication with a controller of the configurable encoder system.

6. The method of claim 5, wherein the first set of spatial offsets comprises offsets in an x-direction.

7. The method of claim 5, where in the second set of spatial offsets comprises offsets in a y-direction.

8. The method of claim 5, wherein the second set of spatial offsets comprises rotational offsets.

9. An encoder system, comprising:
   a configurable detector array including a plurality of detectors;
   a memory configured to store a plurality of partition maps, wherein each partition map defines a state for each of the detectors; and
   a controller operable to execute computer-readable code to perform following operations:
      adjusting a first partition map according to a misalignment in the encoder system; and
      configuring the configurable detector array according to the adjusted first partition map.

10. The encoder system of claim 9, wherein the state for each of the plurality of detectors comprises one of a plurality of quadrature states or OFF.

11. The encoder system of claim 9, wherein adjusting the first partition map comprises linearly shifting the first partition map.

12. The encoder system of claim 11, further comprising:
   an emitter operable to generate a flux modulated by a motion object,
   wherein the configurable detector array is operable to receive the flux and generate respective current outputs for each of the detectors in response to the flux,
   wherein the motion object comprises a code wheel having a polar axis, and
   wherein linearly shifting the first partition map includes shifting the first partition map along a direction parallel to the polar axis or along a direction perpendicular to the polar axis.

13. The encoder system of claim 9, wherein adjusting the first partition map comprises rotating the first partition map.

14. The encoder system of claim 9, further comprising:
   an emitter with a flux distribution, wherein the controller is further operable to adjust the first partition map according to a uniformity of the flux distribution.

15. The encoder system of claim 9, wherein:
   the configurable detector array comprises a configurable magnetic detector array; and
   the plurality of detectors comprises a plurality of magnetic detectors.

16. A method of adjusting an optical encoder system, comprising:
   retrieving a partition map from a memory;
   configuring a configurable photodetector array based on the partition map, the configurable photodetector array comprising a plurality of photodetectors, wherein each photodetector in the configurable photodetector array is assigned a state by the partition map;
   performing a misalignment detection by measuring outputs from the plurality of photodetectors, wherein the outputs correspond to light modulated by a motion object;
   adjusting the partition map according to the misalignment detection, thereby generating an adjusted partition map; and
   storing the adjusted partition map in the memory.

17. The method of claim 16, wherein the misalignment detection includes comparing phases and magnitudes of the outputs.

18. The method of claim 16, wherein the adjusting of the partition map includes linearly shifting the partition map.

19. The method of claim 16, wherein the adjusting of the partition map includes rotating the partition map.

20. The method of claim 16, wherein the adjusting of the partition map includes linearly shifting the partition map followed by rotating the partition map.

21. The method of claim 16, further comprising:
   performing a light intensity detection prior to the misalignment detection; and
   turning off at least one photodetector in the configurable photodetector array to mitigate a light intensity non-uniformity identified by the light intensity detection.

22. The method of claim 16, wherein the storing the adjusted partition map includes overwriting the partition map with the adjusting partition map in the memory.

23. An optical encoder system, comprising:
   a light emitter for emitting a light beam along a light path;

a light modulator placed in the light path for modulating the light beam;

a plurality of photodetectors in an array, wherein each photodetector is operable to generate a current in response to the light beam, and wherein each photodetector has a state assignment defined in a pixel partition map;

means for adding currents generated by the plurality of photodetectors having a same state assignment; and means for changing the state assignment according to a misalignment measurement.

* * * * *